(12) United States Patent
Mathur et al.

(10) Patent No.: US 11,569,219 B2
(45) Date of Patent: Jan. 31, 2023

(54) TSV COUPLED INTEGRATED CIRCUITS AND METHODS

(71) Applicant: Arm Limited, Cambridge (GB)

(72) Inventors: Rahul Mathur, Austin, TX (US); Xiaoqing Xu, Austin, TX (US); Andy Wangkun Chen, Austin, TX (US); Mudit Bhargava, Austin, TX (US); Brian Tracy Cline, Austin, TX (US); Saurabh Pijuskumar Sinha, Schertz, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/077,532

(22) Filed: Oct. 22, 2020

(65) Prior Publication Data

US 2022/0130816 A1 Apr. 28, 2022

(51) Int. Cl.
*H01L 27/02* (2006.01)
*G06F 30/31* (2020.01)
*H01L 21/768* (2006.01)
*H01L 23/535* (2006.01)
*H01L 25/065* (2006.01)
*H01L 25/00* (2006.01)

(52) U.S. Cl.
CPC .......... *H01L 27/0207* (2013.01); *G06F 30/31* (2020.01); *H01L 21/76898* (2013.01); *H01L 23/535* (2013.01); *H01L 25/0657* (2013.01); *H01L 25/50* (2013.01); *H01L 2225/06544* (2013.01)

(58) Field of Classification Search
None
See application file for complete search history.

(56) References Cited

U.S. PATENT DOCUMENTS

| 9,871,020 | B1* | 1/2018 | Ventrone | H01L 25/0657 |
| 2011/0042820 | A1* | 2/2011 | Knickerbocker | H01L 21/76898 257/E21.589 |
| 2011/0309475 | A1 | 12/2011 | Lee | |
| 2012/0014195 | A1* | 1/2012 | Deng | G11C 29/022 365/189.14 |

(Continued)

OTHER PUBLICATIONS

PCT International Search Report and Written Opinion; PCT/GB2021/052728; dated Jan. 19, 2022.

*Primary Examiner* — Tan T. Nguyen
(74) *Attorney, Agent, or Firm* — Pramudji Law Group PLLC; Ari Pramudji (57) ABSTRACT

According to one implementation of the present disclosure, an integrated circuit includes a memory macro unit, and one or more through silicon vias (TSVs) at least partially coupled through the memory macro unit. According to one implementation of the present disclosure, a computer-readable storage medium comprising instructions that, when executed by a processor, cause the processor to perform operations including: receiving a user input corresponding to dimensions of respective pitches of one or more through silicon vias (TSVs); determining whether dimensions of a memory macro unit is greater than a size threshold, wherein the size threshold corresponds to the received user input; and determining one or more through silicon via (TSV) positionings based on the determined dimensions of the memory macro unit.

14 Claims, 7 Drawing Sheets

(56) References Cited

U.S. PATENT DOCUMENTS

| | | | |
|---|---|---|---|
| 2013/0070540 A1* | 3/2013 | Pyeon | G11C 5/147 |
| | | | 327/564 |
| 2017/0125364 A1 | 5/2017 | Cho et al. | |
| 2018/0210994 A1* | 7/2018 | Wuu | G06F 30/398 |
| 2019/0034575 A1 | 1/2019 | Or-Bach et al. | |
| 2019/0384884 A1* | 12/2019 | Thuries | G06F 30/392 |
| 2019/0385995 A1* | 12/2019 | Metras | H01L 23/481 |
| 2021/0373993 A1* | 12/2021 | Sharon | G11C 16/0483 |
| 2022/0037307 A1* | 2/2022 | Lee | H01L 27/0207 |

* cited by examiner

FIG. 8

TSV COUPLED INTEGRATED CIRCUITS AND METHODS

I. FIELD

The present disclosure is generally related to through-silicon vias (TSVs) at least partially coupled through integrated circuit devices.

II. DESCRIPTION OF RELATED ART

Advances in technology have resulted in smaller and more powerful computing devices. For example, a variety of personal computing devices, including wireless telephones, such as mobile and smart phones, gaming consoles, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities. For such devices, there is an ever-increasing demand for greater area efficiency for memory storage capacity and read/write capabilities.

In a three-dimensional (3D) semiconductor stack, either full or partial through-silicon vias (TSVs) would be required to transmit signals out of the back portion of a semiconductor wafer (i.e., substrate). In this context, "full TSV" may be defined as a TSV traversing an entire BEOL (back end of line) stack, while "partial TSV" may be defined as a TSV traversing a portion of the BEOL stack. Currently, TSVs are positioned to go through layers of such devices at a top portion of the substrate and below the BEOL.

In the current state of the art, one or more TSVs are placed outside (e.g., positioned along a side portion) of the memory macro (i.e., a memory macro unit) (e.g., an SRAM memory macro). For example, with reference to larger macros of 3D stacks, such placement outside of the memory macro can displace a TSV required for connection (to another location above or below in a 3D stack) by hundreds of microns (e.g., the size of the larger macro itself). Consequently, such a displacement would cause significant disruption to input/output delay of the 3D stack. One solution to resolve TSV displacement issues may be to piece together a bigger memory macro from multiple smaller memory macros that would fit within the smaller memory macro's pitch. However, such smaller macros would have worse area efficiency (i.e., the bit-cell area/total macro area) due to relatively larger overhead of memory macro peripheral logic. Furthermore, it is also possible that the pitch of the TSVs for a particular technology can be so fine that it would not allow a macro of reasonable size to fit. Accordingly, especially as increasingly finer TSV pitches (i.e., below 10 μm) become viable, there is a need in the art for more area efficiency in memory macro design.

III. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

Particular implementations of the present disclosure are described below with reference to the drawings. In the description, common features are designated by common reference numbers throughout the drawings.

According to one implementation of the present disclosure, an integrated circuit includes a memory macro unit, and one or more through silicon vias (TSVs) at least partially coupled through the memory macro unit. In one example, the memory macro unit includes one or more word-line decoder blocks; two or more memory arrays coupled to the one more word-line decoder blocks; control circuitry coupled to the one or word-line decoder blocks and the two or more memory arrays; and respective input/output (I/O) circuitry for each of the two or more memory arrays, wherein each of the I/O circuitry comprises sense amplifier circuitry, a pre-charge circuit, a column multiplexer, and input and output latches.

According to one implementation of the present disclosure, a method includes fabricating a memory macro unit, forming a through silicon via (TSV); and bonding the TSV vertically and at least partially through the memory macro unit.

According to one implementation of the present disclosure, a computer-readable storage medium comprising instructions that, when executed by a processor, cause the processor to perform operations including: receiving a user input corresponding to dimensions of respective pitches of one or more through silicon vias (TSVs); determining whether dimensions of a memory macro unit is greater than a size threshold, wherein the size threshold corresponds to the received user input; and determining one or more through silicon via (TSV) positionings based on the determined dimensions of the memory macro unit.

Typical TSV placement requires a certain amount for "free" back-end and front-end space. However, existing memory macro designs are too dense to accommodate such TSV placement. Advantageously, inventive aspects of the present invention allow for "feedthrough" TSV (Through Silicon Via) (i.e., configurable TSV) for memory macros (e.g., SRAM memory macro). Thus, there would be no need to break down larger memory instances to accommodate TSV placement. Additionally, the inventive aspects also further provide for suitable placement sites for such TSV placement. The inventive circuits and methods can further be applicable for both face-to-face or face-to-back wafer stacking technologies, as well as monolithic integration technologies. In various implementations, to save area in the placement of TSVs in 3D stacked designs, the inventive aspects modify macros to support TSV channels to run through the macros (as opposed to outside (i.e., running along a side portion) and adjacent of the semiconductor wafer (e.g., 3D semiconductor stacks)).

In certain schemes and techniques, as described herein, the inventive methods support memory compiler graphical user interfaces (GUI) to generate memory instances (i.e., macros) with TSV feedthrough capability. Moreover, a tiling engine of the memory compiler can support stitching such memory instances together to allow feedthrough TSVs with minimized area penalty. In various implementations, an area "keep out zone" may be included as a surrounding perimeter for TSV placement. Advantageously, such keep out zones may overlap over whitespaces within the memory macro. Hence, a higher area utilization may be realized at the system-on-chip (SoC) level. In various examples, the inventive circuits, systems, and methods can be utilized for TSV configuration within macros such as: SRAM, and other memory such as read-only memory (ROM), non-volatile memory (NVM), CAM, or register files.

Certain definitions have been provided herein for reference. The term "macro" and "instance" have been utilized interchangeably—as in what is delivered from a memory compiler. A "macro" may have "butterfly architecture" (but not required), may be split into "banks", "column-multiplexing", and/or various other design features (e.g., power gating, redundancy, write mask) as per the decisions of a macro unit's (e.g., SRAM's) "architecture". An instance may be "single-banked" or "multi-banked". Also, each bank is a nearly-complete subset of the memory instance. And a large instance may be broken down into "smaller chunks" (each with separate control, word-line drivers, bit-cell array, input/output) for substantially performance and power reasons. For a particular "architecture", the "instance" can have varying number of rows, columns, and banks to achieve the desired capacity. Multiple "instances" can be stitched together to implement a cache at a system-on-chip (SoC) level. Column multiplexers (or column mux) may be as part of input/output (I/O) circuitry, and the I/O circuitry includes several other blocks, including, but not limited to: sense amplifier, write driver, and precharge devices.

Figure 1:
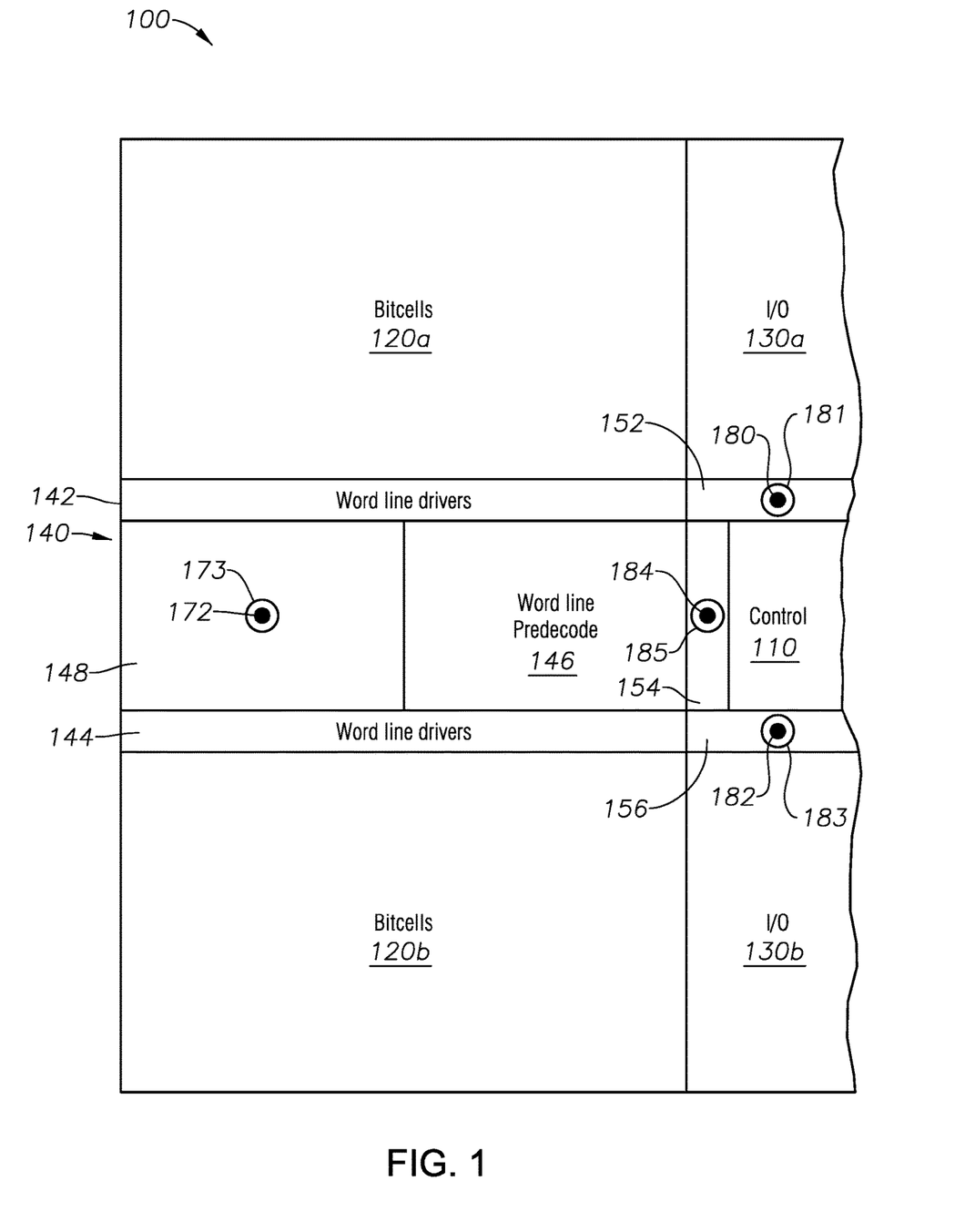
FIG. 1 is a schematic diagram of a portion of an example integrated circuit in accordance with various implementations described herein.

Referring to FIG. 1, an example portion of an integrated circuit (e.g., a system-on-chip (SoC)) is shown. As illustrated, the integrated circuit may include a memory macro unit 100 (e.g., static random-access memory (S-RAM) memory macro section implementable on the SoC, ROM, non-volatile memory (NVM), CAM, or register file) and one or more through silicon vias (TSVs) (e.g., 172, 180, 182, 184) at least partially coupled through the memory macro unit 100. In certain implementations, the one or more TSVs may intersect the memory macro unit 100 in a substantially perpendicular orientation (i.e., direction) to extend vertically through a 3D memory stack. In particular aspects, the TSVs may be utilized by the SoC for power, ground, input/output signals, or address pre-decoding signals.

As depicted in FIG. 1, the memory macro unit 100 (e.g., core array structure, "floor plan") may include: a control circuitry (i.e., a control block) 110, one or more core arrays 120 (e.g., 120a, 120b, etc.) (i.e., one more bit-cell arrays, memory arrays), respective input/output circuitries (i.e., I/O blocks) 130 (e.g., 130a, 130b), and a word-line decoder circuitry 140 (i.e., word line decoder block). In certain implementations, the control block 110 may be coupled to the one or more core arrays 120, the respective I/O blocks 130a, 130b, and the word-line decoder block 140. In various implementations, each of the I/O blocks 130 may include sense amplifier circuitry, a pre-charge circuit, a column multiplexer, and input and output latches.

In some implementations, the word-line decoder block 140 may include first- and second-word line driver circuitries 142, 144, and a word line pre-decode circuitry 146. Also, in an example, in certain candidate "white-space" regions 148 (i.e., a candidate region without circuitry in the wdx128_min+repeating wdx*_mid) of the word line decoder block 140, a TSV 172 can be accommodated (as discussed in later paragraphs). Surrounding the TSV 172, a "keep-out zone" 173 may be included to provide sufficient space between the various surrounding circuitry and the TSV 172. As such a white space region is relatively large, such a region is suitable where requirement of a keep-out zone is also relatively large.

In some implementations, adjacent to and surrounding the control block 110, one or more other candidate white-space regions 152, 154, and 156 may be included. As examples, the white-space region 152 may be introduced between the control block 110 and a first I/O block 130a; the white-space region 154 may be introduced between the control block 110 and the word-line pre-decode block 146; and white-space region 156 may be introduced between the control block 110 and a second I/O block 130b.

Furthermore, in such candidate white-space regions 152, 154, and 156, respective TSVs 180, 182, and 184 may be accommodated (as discussed in later paragraphs). In addition, each of the TSVs 180, 182, and 184 would also have respective surrounding keep-out zones 181, 183, and 185 to provide sufficient space between the various surrounding circuitry and the TSVs 180, 182, and 184.

Figure 2:
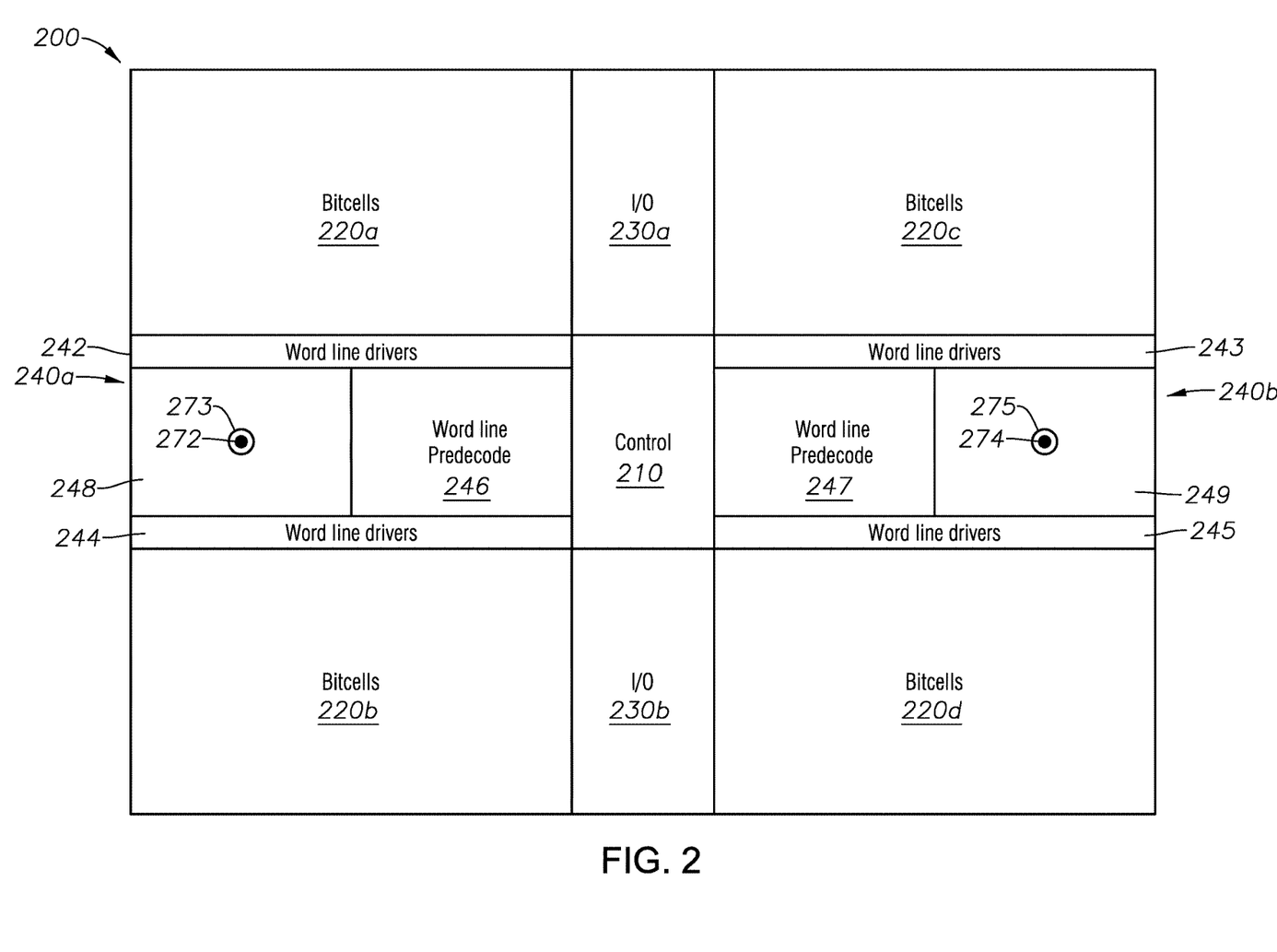
FIG. 2 is a schematic diagram of a portion of an example integrated circuit in accordance with various implementations described herein.

Referring to FIG. 2, an example portion of an integrated circuit (e.g., a system-on-chip (SoC)) is shown. As illustrated, the integrated circuit may include a memory macro unit 200 (e.g., static random-access memory (S-RAM) memory macro section, a "butterfly architecture" implementable on the SoC, ROM, non-volatile memory (NVM), CAM, or register file) and one or more through silicon vias (TSVs) (e.g., 272, 274) at least partially coupled through the memory macro unit 200. In certain implementations, the one or more TSVs may intersect the memory macro unit 100 in a substantially perpendicular orientation (i.e., direction) to extend vertically through a 3D memory stack.

As depicted in FIG. 2, the memory macro unit 100 (e.g., core array structure, "floor plan") may include: a control circuitry (i.e., a control block) 210, one or more core arrays 220 (e.g., 220a, 220b, 220c, 220d, etc.) (i.e., one more bit-cell arrays, memory arrays), respective input/output circuitries (i.e., I/O blocks) 230 (e.g., 230a, 230b), and first and second word-line decoder circuitry (i.e., first and second word line decoder blocks) 240a, 240b. In certain implementations, the control block 210 may be coupled to the one or more core arrays 220, the respective I/O blocks 230a, 230b, and the first and second word-line decoder blocks 240a, 240b. In various implementations, each of the I/O blocks 230a, 230b may include sense amplifier circuitry, a pre-charge circuit, a column multiplexer, and input and output latches.

In some implementations, each of the first and second word-line decoder blocks 240 (240a, 240b) may include first and second word line driver circuitries (242, 244; 243, 245) and a word line pre-decode circuitry (246, 247). Also, in an example, in certain candidate "white-space" regions 248, 249 (i.e., a candidate region without circuitry in the wdx128_min+repeating wdx*_mid) of the first and second word line decoder blocks 240a, 240b, a respective TSV 272, 274 can be accommodated (as discussed in later paragraphs). Surrounding each of the TSVs 272, 274, a respective "keep-out zone" 273, 275 would be included to provide sufficient space between various surrounding circuitry and the TSVs 273, 275. As such white space regions are relatively large, such regions are suitable where requirement of a keep-out zone is also relatively large.

Figure 3:
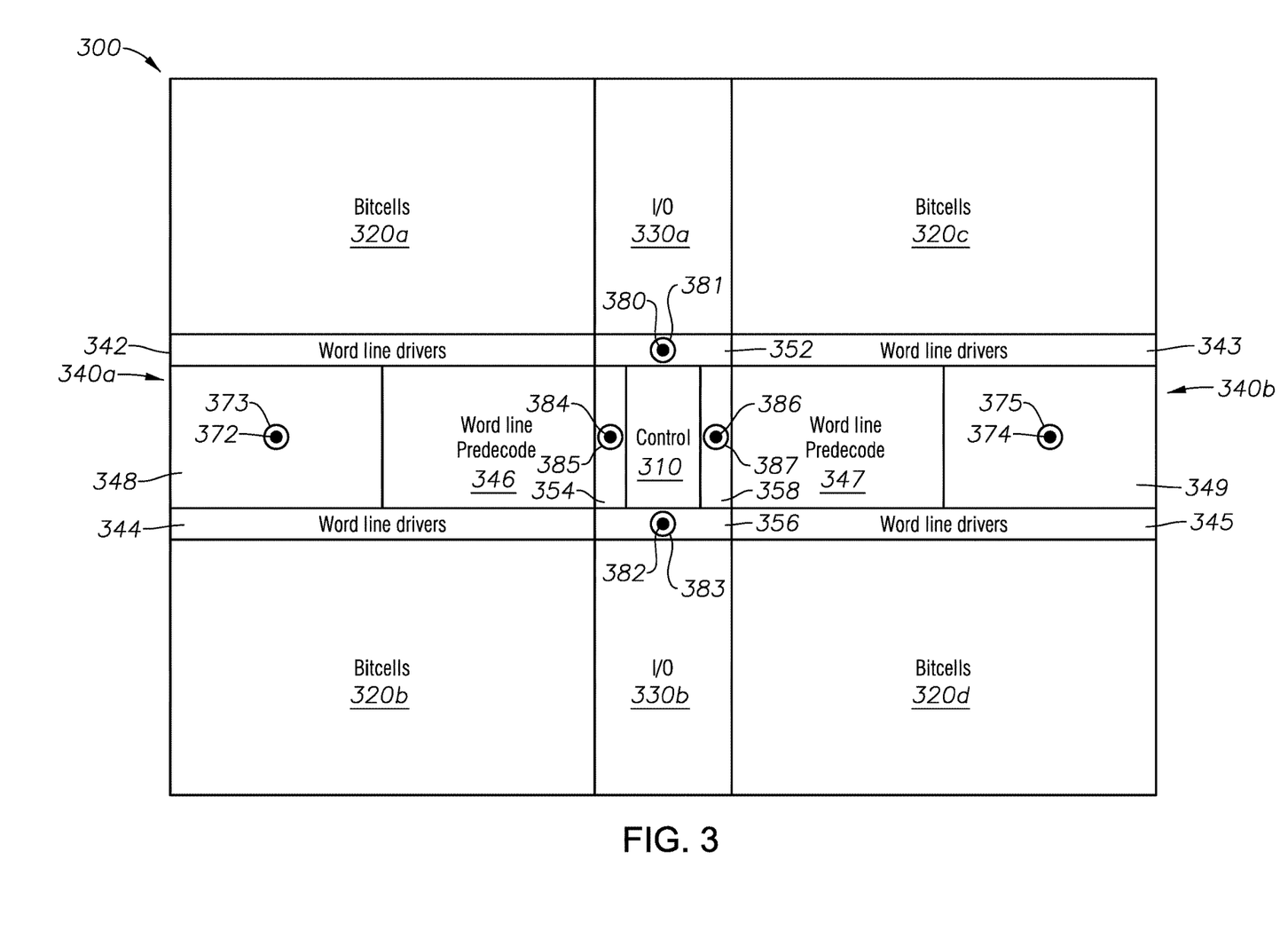
FIG. 3 is a schematic diagram of a portion of an example integrated circuit in accordance with various implementations described herein.

Referring to FIG. 3, an example portion of an integrated circuit (e.g., a system-on-chip (SoC)) is shown. As illustrated, the integrated circuit may include a memory macro unit 300 (e.g., static random-access memory (S-RAM) memory macro section, a "butterfly architecture" implementable on the SoC, ROM, non-volatile memory (NVM), CAM, or register file) and one or more through silicon vias (TSVs) (e.g., 372, 374, 380, 382, 384, 386) at least partially coupled through the memory macro unit 300. In certain implementations, the one or more TSVs may intersect the memory macro unit 100 in a substantially perpendicular orientation (i.e., direction) to extend vertically through a 3D memory stack.

As depicted in FIG. 3, the memory macro unit 300 (e.g., core array structure, "floor plan") may include: a control circuitry (i.e., a control block) 310, one or more core arrays 320 (e.g., 320a, 320b, 320c, 320d, etc.) (i.e., one more bit-cell arrays, memory arrays), respective input/output circuitries (i.e., I/O blocks) 330 (e.g., 330a, 330b), and first and second word-line decoder circuitry (i.e., first and second word line decoder blocks) 340 (e.g., 340a, 340b). In certain implementations, the control block 310 may be coupled to the one or more core arrays 320, the respective I/O blocks 330a, 330b, and the first and second word-line decoder blocks 340a, 340b. In various implementations, each of the I/O blocks 330 may include sense amplifier circuitry, a pre-charge circuit, a column multiplexer, and input and output latches.

In some implementations, each of the first and second word-line decoder blocks 340 (340a 340b) may include first and second word line driver circuitries (342, 344; 343, 345) and a word line pre-decode circuitry (346, 347). Also, in an example, in certain candidate "white-space" regions 348, 349 (i.e., a candidate region without circuitry in the wdx128_min+repeating wdx*_mid) of the first and second word line decoder blocks 340a, 340b, a respective TSV 372, 374 can be accommodated (as discussed in later paragraphs). Surrounding each of the TSVs 372, 374, a respective "keep-out zone" 373, 375 would be included to provide sufficient space between the various surrounding circuitry and the TSVs 372, 374. As such white space regions are relatively large, such regions are suitable where requirement of a keep-out zone is also relatively large.

In some implementations, as illustrated in FIG. 3, adjacent to and surrounding the control block 310, one or more other candidate white-space regions 352, 354, 356, 358 may be included. As examples, the white-space region 352 may be introduced between the control block 310 and a first I/O block 330a; the white-space region 354 may be introduced between the control block 310 and the first word-line pre-decode block 346; the white-space region 356 may be introduced between the control block 310 and a second I/O block 330b; and the white space region 358 may be introduced between the control block 310 and the second word-line pre-decode block 347.

Furthermore, in such candidate white-space regions 352, 354, 356, and 358, respective TSVs 380, 382, 384, and 386 may be accommodated (as discussed in later paragraphs). In addition, each of the TSVs 380, 382, 384, and 386 would also have respective surrounding keep-out zones 381, 383, 385, and 387 to provide sufficient space between the various surrounding circuitry and the respective TSVs 380, 382, 384, and 386. Advantageously, such candidate white-space regions allow for the accommodation of at least a few TSV per macro, and would still be more area efficient than potentially breaking a macro into smaller macros to fit into a desired TSV pitch.

Figure 4:
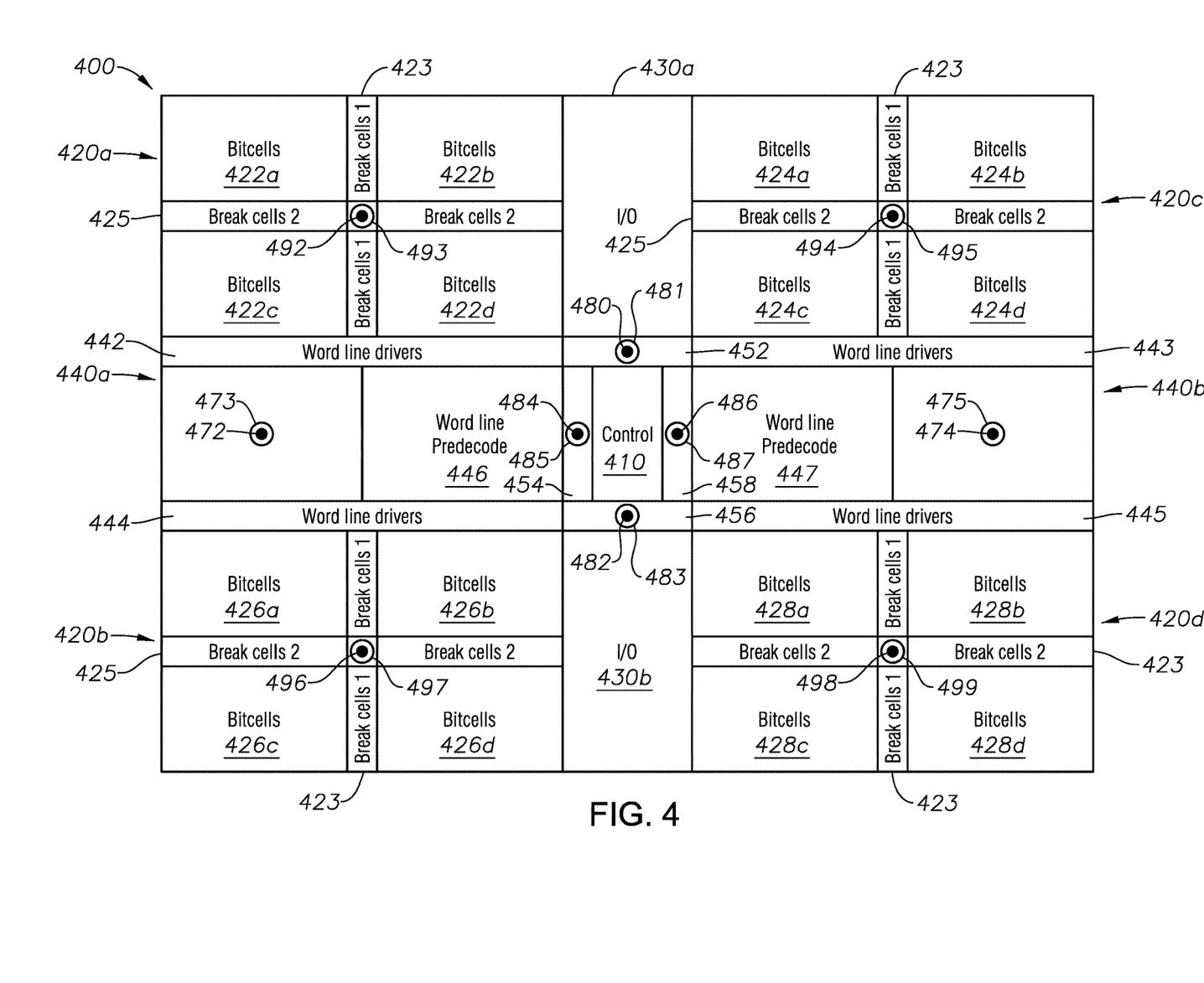
FIG. 4 is a schematic diagram of a portion of an example integrated circuit in accordance with various implementations described herein.

Referring to FIG. 4, an example portion of an integrated circuit (e.g., a system-on-chip (SoC)) is shown. As illustrated, the integrated circuit may include a memory macro unit 400 (e.g., static random-access memory (S-RAM) memory macro section, a "butterfly architecture" implementable on the SoC, ROM, non-volatile memory (NVM), CAM, or register file) and one or more through silicon vias (TSVs) (e.g., 472, 474, 480, 482, 484, 486, 492, 494, 496, 498) at least partially coupled through the memory macro unit 400. In certain implementations, the one or more TSVs may intersect the memory macro unit 400 in a substantially perpendicular orientation (i.e., direction) to extend vertically through a 3D memory stack.

As depicted in FIG. 4, the memory macro unit 400 (e.g., core array structure, "floor plan") may include: a control circuitry (i.e., a control block) 410, one or more core arrays 420 (e.g., 420a, 420b, 420c, 420d, etc.) (i.e., one more bit-cell arrays, memory arrays), respective input/output circuitries (i.e., I/O blocks) 430 (e.g., 430a, 430b), and first and second word-line decoder circuitry (i.e., first and second word line decoder blocks) 440 (e.g., 440a, 440b). In certain implementations, the control block 410 may be coupled to the one or more core arrays 420, the respective I/O blocks 430a, 430b, and the first and second word-line decoder blocks 440a, 440b. In various implementations, each of the I/O blocks 430 may include sense amplifier circuitry, a pre-charge circuit, a column multiplexer, and input and output latches. Advantageously, the implementation of FIG. 4 can be configured to accommodate several TSVs per memory macro unit.

As illustrated in FIG. 4, each of the one or more core arrays 420 (e.g., 420a, 420b, 420c, 420d) may be divided up into multiple sections by the inclusion of break cells (e.g., 423, 425). As one example, first and second break cells 423, 425 are included in each of the one or more core arrays 420 to separate each core array into four bit-cell sections (e.g., 422a, 422b, 422c, 422d; 424a, 424b, 424c, 424d; 426a, 426b, 426c, 426d; and 428a, 428b, 428c, 428d). In some cases, the first break cells 423 may be utilized for substrate ground taps or bit-line resistive-capacitive (RC) optimization schemes involving specialized routing or hierarchy. In some cases, the second break cells 425 may be used for word-line re-buffering.

In doing so, a TSV (e.g., 492, 494, 496, and 498) may be placed in a respective middle portion "white-space" of each of the core arrays 420 in alignment with the intersection of the first and second break cells 423, 425. Moreover, similar to other implementations, surrounding each of the TSVs 492, 494, 496, and 498, a respective "keep-out zone" 493, 495, 497, and 499 would be included to provide sufficient space between the various surrounding circuitry and the TSVs 492, 494, 496, and 498.

Similar to other implementations, in some cases, each of the first and second word-line decoder blocks 440 (440a 440b) may include first and second word line driver circuitries (442, 444; 443, 445) and a word line pre-decode circuitry (446, 447). Also, in an example, in certain candidate "white-space" regions 448, 449 (i.e., a candidate region without circuitry in the wdx128_min+repeating wdx*_mid) of the first and second word line decoder blocks 440a, 440b, a respective TSV 472, 474 can be accommodated (as discussed in later paragraphs). Surrounding each of the TSVs 472, 474, a "keep-out zone" 473, 475 would be included to provide sufficient space between the various surrounding circuitry and the respective TSV 472, 474.

Similar to other implementations, in some cases, as illustrated in FIG. 4, adjacent to and surrounding the control block 410, one or more other candidate white-space regions 452, 454, 456, 458 may be included. As examples, the white-space region 452 may be introduced between the control block 410 and a first I/O block 430a; the white-space region 454 may be introduced between the control block 410 and the first word-line pre-decode block 446; the white-space region 456 may be introduced between the control block 410 and a second I/O block 430b; and the white space region 458 may be introduced between the control block 410 and the second word-line pre-decode block 447.

Furthermore, in such candidate white-space regions 452, 454, 456, and 458, respective TSVs 480, 482, 484, and 486 may be accommodated (as discussed in later paragraphs). In addition, each of the TSVs 480, 482, 484, and 486 would also have respective surrounding keep-out zones 481, 483, 485, and 487 to provide sufficient space between the various surrounding circuitry and the TSVs 480, 482, 484, and 486.

Figure 5:
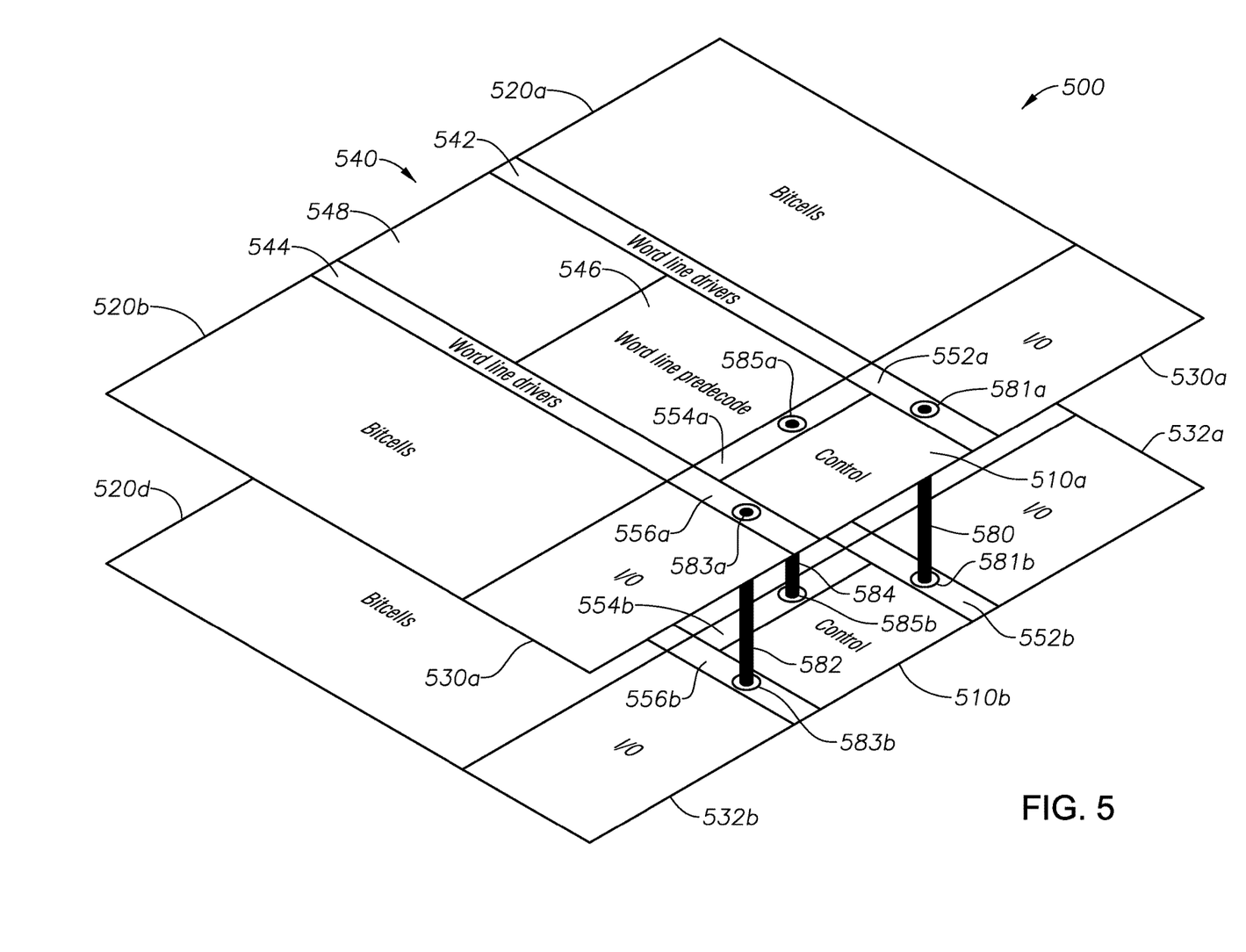
FIG. 5 is a schematic diagram of a portion of an example integrated circuit in accordance with various implementations described herein.

Referring to FIG. 5, an example portion of an integrated circuit (e.g., a system-on-chip (SoC)) is shown. As illustrated, the integrated circuit may include one or more folded-pairs of a memory macro unit 500 (e.g., static random-access memory (S-RAM) memory macro section, a "butterfly architecture" implementable on the SoC, ROM, non-volatile memory (NVM), CAM, or register file) and one or more through silicon vias (TSVs) (e.g., 580, 582, 584) at least partially coupled through the memory macro unit 500. In certain implementations, the one or more TSVs may intersect the memory macro unit 500 in a substantially perpendicular orientation (i.e., direction) to extend vertically through a 3D memory stack. Advantageously, such folding of the memory macro unit 500 and the use of TSVs allow for the routing of critical global signals that can be extended to two or more tier levels of a 3D stack. Examples of such global signals may include the external clock, internal memory clock, the pre-decoded addresses, memory bank read output, and memory bank write input.

As depicted in FIG. 5, on each tier, the memory macro unit 500 (e.g., core array structure, "floor plan") may include: a control circuitry (i.e., a control block) 510 (e.g., 510a, 510b), one or more core arrays 520 (e.g., 520a, 520b, 520c, 520d, etc.) (i.e., one more bit-cell arrays, memory arrays), respective input/output circuitries (i.e., I/O blocks) 530 (e.g., 530a, 530b, 532a, 532b), and first and second word-line decoder circuitry (i.e., first and second word line decoder blocks) 540 (e.g., 540a, 540b (not shown but present). In certain implementations, on each tier, the control block 510 may be coupled to the one or more core arrays 520, the respective I/O blocks 530, and the first and second word-line decoder blocks 540a, 540b. In various implementations, each of the I/O blocks 430 may include sense amplifier circuitry, a pre-charge circuit, a column multiplexer, and input and output latches. Advantageously, the implementation of FIG. 5 can be configured to accommodate several TSVs per memory macro unit.

Similar to other implementations, in some cases, on each of the first and second tiers of the memory macro 500, each of the first and second word-line decoder blocks 540 (540a 540b) may include first and second word line driver circuitries (542, 544; 543, 545) and a word line pre-decode circuitry (546, 547). Also, in an example, in certain candidate "white-space" regions 548, 549 (i.e., a candidate region without circuitry in the wdx128_min+repeating wdx*_mid) of the first and second word line decoder blocks 540a, 540b, a respective TSV (not shown in FIG. 5, but would be present in certain implementations) can be accommodated (as discussed in later paragraphs). Surrounding each of the TSVs, a "keep-out zone" (not shown in FIG. 5, but would be present in certain implementations) would be included to provide sufficient space between the various surrounding circuitry and the respective TSV.

Similar to other implementations, in some cases, as illustrated in FIG. 5, adjacent to and surrounding the control block 510 (510a, 510b), one or more other candidate white-space regions 552 (552a, 552b), 554 (554a, 554b) and 556 (556a, 556b) may be included. As examples, on a first tier, the white-space region 552a may be introduced between the control block 510 and a first I/O block 530a; the white-space region 554a may be introduced between the control block 410a and the first word-line pre-decode block 546; and the white-space region 556a may be introduced between the control block 510a and a second I/O block 530b. Moreover, on a second tier, the white-space region 552b may be introduced between the control block 510b and a first I/O block 532a of a second tier; the white-space region 554b may be introduced between the control block 510b and the second word-line pre-decode block 447; and the white-space region 556b may be introduced between the control block 510b and a second I/O block 532b.

Furthermore, in such candidate white-space regions 552 (552a, 552b), 554 (554a, 554b) and 556 (556a, 556b), respective TSVs 580, 582, 584 may be accommodated (as discussed in later paragraphs). In addition, each of the TSVs 580, 582, 584 would also have respective surrounding keep-out zones 581 (581a, 581b), 583 (583a, 583b) and 585 (585a, 585b) to provide sufficient space between the various surrounding circuitry and the TSVs 580, 582, and 584.

Also, while not shown in FIG. 5, similar to FIG. 4, each of the one or more core arrays 520 (e.g., 520a, 520b, 520c, 520d) may be divided up into multiple sections by the inclusion of break cells. As one example, first and second break cells can be included in each of the one or more core arrays 520 to separate each core array into four bit-cell sections. In some cases, the first break cells may be utilized for substrate ground taps or bit-line resistive-capacitive (RC) optimization schemes involving specialized routing or hierarchy. In some cases, the second break cells may be used for word-line re-buffering.

In doing so, a TSV may be placed in a respective middle portion "white-space" of each of the core arrays 520 in alignment with the intersection of the first and second break cells. Moreover, similar to other implementations, surrounding each of such TSVs, a respective "keep-out zone" would be included to provide sufficient space between the various surrounding circuitry and the TSVs.

Figure 6:
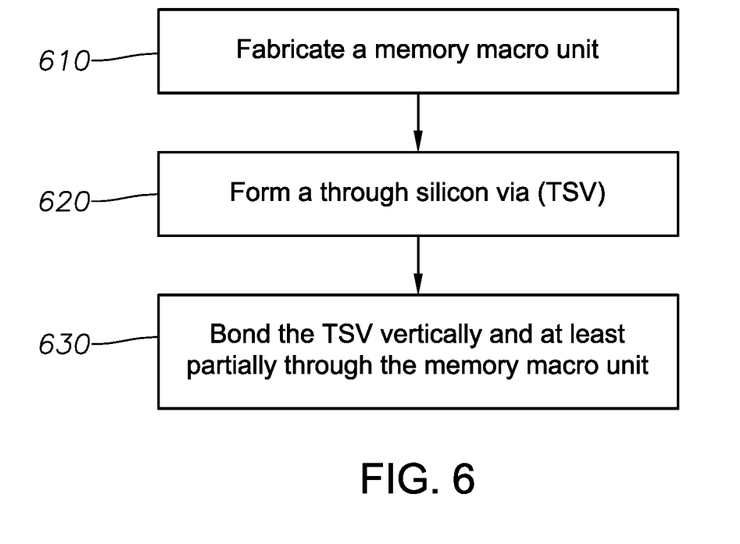
FIG. 6 is an operation method in accordance with various implementations described herein.

Referring to FIG. 6, a flowchart of an example formation method 600 (i.e., procedure) to for feedthrough TSV integration is shown. Advantageously, in various implementations, the method 600 depicts the fabrication method steps for a three-dimensional semiconductor stack. The method 600 may be implemented with reference to circuit implementations as shown in FIGS. 1-5.

At block 610, the method includes fabricating a memory macro unit. For instance, with reference to various implementations as described in FIGS. 1-5, a memory macro unit (100, 200, 300, 400, 500) may be fabricated from a multi-step sequence of photolithographic and chemical processing steps (such as surface passivation, thermal oxidation, planar diffusion, and junction isolation) during which electric circuits are gradually created on a wafer made of semiconducting material.

At block 620, the method includes forming a through silicon via (TSV). For instance, with reference to various implementations as described in FIGS. 1-5, a through silicon via (TSV) (e.g., 472, 474, 480, 482, 484, 486, 492, 494, 496, 498) may be formed by etching a TSV trench from a substrate, filling the TSV trench with copper, and fabricating a back-end-of-line (BEOL) wiring to be coupled to the TSV.

At block 630, the method includes bonding the TSV vertically and at least partially through the memory macro unit. For instance, with reference to various implementations as described in FIGS. 1-5, a through silicon via (TSV) (e.g., 472, 474, 480, 482, 484, 486, 492, 494, 496, 498) may be bonded vertically and at least partially through the memory macro unit (100, 200, 300, 400, 500).

Also, according to other aspects of the operational method, the TSV may be revealed by removing a layer from a back portion of a substrate (e.g., semiconductor wafer). In other aspects, the TSV may be adjoined to a back-end-of-line (BEOL) stack, where the BEOL stack can be coupled to a face-to-face semiconductor wafer bond.

As one consequence of TSV pitches increasingly becoming "finer" (e.g., below 10 below 10 µm) having size dimensions smaller than the memory macro itself, in the current state of the art, TSVs had to be placed outside of a 3D semiconductor stack. (In various design, having a finer TSV pitch is desirable for multiple reasons including superior signal connectivity, and favorable power distribution and heat removal capabilities.) However, outside TSV placement would be problematic for larger size dimension macros as doing so would displace a required TSV (for connection to another location above or below in a 3D stack) by hundreds of microns (e.g., the size of the macro unit itself), and thus cause I/O delay for the overall 3D stack. The below inventive method provides one solution for this concern.

Figure 7:
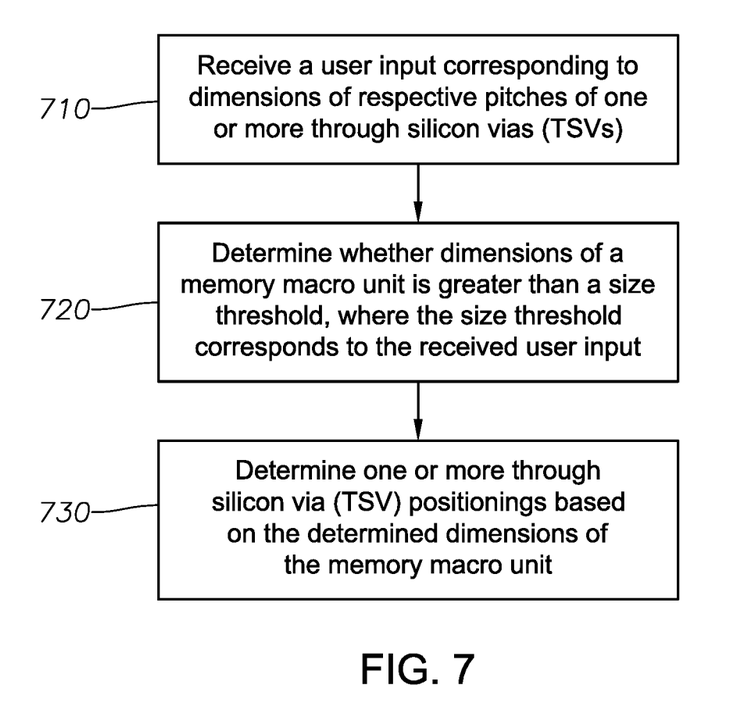
FIG. 7 is an operation method in accordance with various implementations described herein.

Referring to FIG. 7, a flowchart of an example operational method 700 (i.e., procedure) to automatically optimize a memory compiler is shown. Advantageously, in various implementations, the method 700 may flexibly account for area requirements of memory architecture in real-time. The method 700 may be implemented with reference to circuit implementations as shown in FIGS. 1-5.

Figure 8:
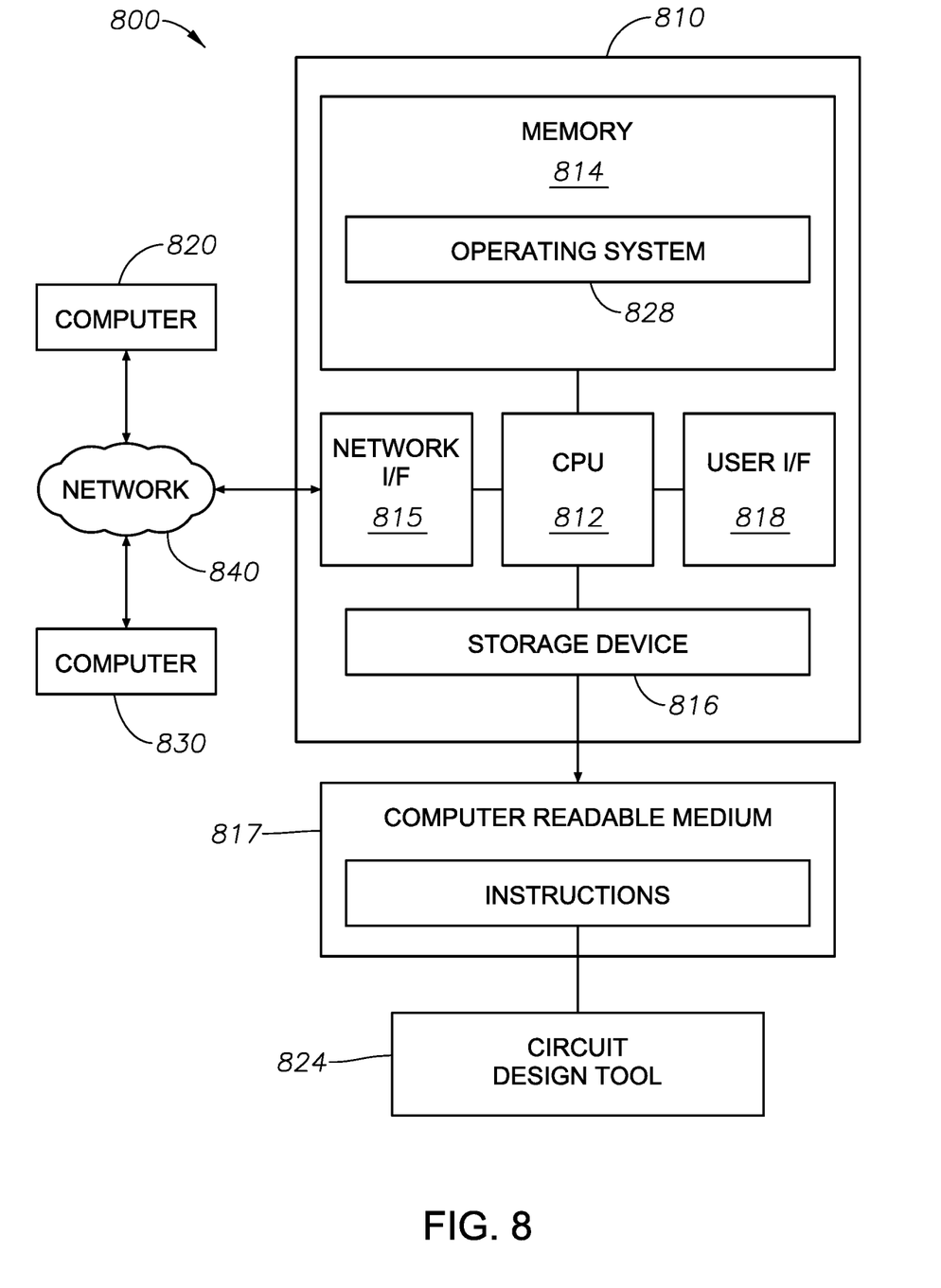
FIG. 8 is a block diagram in accordance with various implementations described herein.

At block 710, the method includes receiving a user input corresponding to dimensions of respective pitches of one or more through silicon vias (TSVs). For instance, with reference to various implementations as described in FIGS. 1-6, a central processing unit (as shown in FIG. 8) may execute software instructions based on one or more of received user provided TSV size dimensions (i.e., one or more TSV pitch values).

At block 720, the method includes determining whether dimensions of a memory macro unit is greater than a size threshold, where the size threshold corresponds to the received user input. For instance, with reference to various implementations as described in FIGS. 1-5, a central processing unit (as shown in FIG. 8) may execute software instructions (i.e., a memory compiler software program) to determine whether dimensions of a memory macro unit is greater than a size threshold, where the size threshold corresponds to the received user input (i.e., user provided/user input TSV pitch value(s) on the circuit design).

At block 730, the method includes determining one or more through silicon via (TSV) positionings based on the determined dimensions of the memory macro unit. For instance, with reference to various implementations as described in FIGS. 1-5, a central processing unit (as shown in FIG. 8) may execute software instructions to determine one or more optimized TSV positionings based on whether the determined dimensions of the memory macro unit is greater than the size threshold corresponding to the received user input.

Also, according to other aspects of the operational method, an output may be generated based on the determined optimized positioning. For example, with reference to various implementations as described in FIGS. 1-5, an output (i.e., an integrated circuit design) (e.g., a memory architecture, multi-threshold offerings for memory compilers) may be generated based on the determined one or more optimized TSV positionings. In some implementations, the circuit design tool 824 (as described with reference to FIG. 8) may allow users to input a TSV pitch value, and generate memory macro unit(s) that either fit within a predetermined TSV pitch or provide a feed-through TSV option (i.e., an option allowing for at least a partial coupling through (i.e., at least partially within) the memory macro unit(s)).

FIG. 8 illustrates example hardware components in the computer system 800 that may be used to determine an optimized TSV positioning and to generate an integrated circuit design/memory architecture output. In certain implementations, the example computer system 800 (e.g., networked computer system and/or server) may include circuit design tool 824) and execute software based on the procedure as described with reference to the method 700 in FIG. 7. In certain implementations, the circuit design tool 824 may be included as a feature of an existing memory compiler software program allowing users to input a TSV pitch, and generate memory macros that either fit within the TSV pitch or provide a feed-through TSV option (i.e., an option allowing for at least a partial coupling through (i.e., at least partially within) the memory macro unit(s)).

The circuit design tool 824 may provide generated computer-aided physical layout designs for memory architecture. The procedure 800 may be stored as program code as instructions 817 in the computer readable medium of the storage device 816 (or alternatively, in memory 814) that may be executed by the computer 810, or networked computers 820, 830, other networked electronic devices (not shown) or a combination thereof. In certain implementations, each of the computers 810, 820, 830 may be any type of computer, computer system, or other programmable electronic device. Further, each of the computers 810, 820, 830 may be implemented using one or more networked computers, e.g., in a cluster or other distributed computing system.

In certain implementations, the system 800 may be used with semiconductor integrated circuit (IC) designs that contain all standard cells, all blocks or a mixture of standard cells and blocks. In a particular example implementation, the system 800 may include in its database structures: a collection of cell libraries, one or more technology files, a plurality of cell library format files, a set of top design format files, one or more Open Artwork System Interchange Standard (OASIS/OASIS.MASK) files, and/or at least one EDIF file. The database of the system 800 may be stored in one or more of memory 814 or storage devices 816 of computer 810 or in networked computers 820, 820.

The system 800 may perform the following functions automatically, with variable user input: determination of read current requirements/thresholds, determination of leakage current requirements/thresholds, identification of logic designs (i.e., periphery circuit designs (i.e., logic threshold voltages, threshold voltage implant layers)), determination of a desired threshold voltage-combination, determination of minimum voltage assist requirements, identification of bit-cell types, determination of memory specific optimization modes (memory optimization mode), floor-planning, including generation of cell regions sufficient to place all standard cells; standard cell placement; power and ground net routing; global routing; detail routing and pad routing. In some instances, such functions may be performed substantially via user input control. Additionally, such functions can be used in conjunction with the manual capabilities of the system 800 to produce the target results that are required by a designer. In certain implementations, the system 800 may also provide for the capability to manually perform functions such as: cell region creation, block placement, pad and cell placement (before and after automatic placement), net routing before and after automatic routing and layout editing. Moreover, verification functions included in the system 800 may be used to determine the integrity of a design after, for example, manual editing, design rule checking (DRC) and layout versus schematic comparison (LVS).

In one implementation, the computer 800 includes a central processing unit (CPU) 812 having at least one hardware-based processor coupled to a memory 814. The memory 814 may represent random access memory (RAM) devices of main storage of the computer 810, supplemental levels of memory (e.g., cache memories, non-volatile or backup memories (e.g., programmable or flash memories)), read-only memories, or combinations thereof. In addition to the memory 814, the computer system 800 may include other memory located elsewhere in the computer 810, such as cache memory in the CPU 812, as well as any storage capacity used as a virtual memory (e.g., as stored on a storage device 816 or on another computer coupled to the computer 810).

The computer 810 may further be configured to communicate information externally. To interface with a user or operator (e.g., a circuit design engineer), the computer 810 may include a user interface (I/F) 818 incorporating one or more user input devices (e.g., a keyboard, a mouse, a touchpad, and/or a microphone, among others) and a display (e.g., a monitor, a liquid crystal display (LCD) panel, light emitting diode (LED), display panel, and/or a speaker, among others). In other examples, user input may be received via another computer or terminal. Furthermore, the computer 810 may include a network interface (I/F) 815 which may be coupled to one or more networks 840 (e.g., a wireless network) to enable communication of information with other computers and electronic devices. The computer 860 may include analog and/or digital interfaces between the CPU 812 and each of the components 814, 815, 816, and 818. Further, other non-limiting hardware environments may be used within the context of example implementations.

The computer 810 may operate under the control of an operating system 826 and may execute or otherwise rely upon various computer software applications, components, programs, objects, modules, data structures, etc. (such as the programs associated with the procedure 700 and the method 700 and related software). The operating system 828 may be stored in the memory 814. Operating systems include, but are not limited to, UNIX® (a registered trademark of The Open Group), Linux® (a registered trademark of Linus Torvalds), Windows® (a registered trademark of Microsoft Corporation, Redmond, Wash., United States), AIX® (a registered trademark of International Business Machines (IBM) Corp., Armonk, N.Y., United States) i5/OS® (a registered trademark of IBM Corp.), and others as will occur to those of skill in the art. The operating system 826 in the example of FIG. 8 is shown in the memory 814, but components of the aforementioned software may also, or in addition, be stored at non-volatile memory (e.g., on storage device 816 (data storage) and/or the non-volatile memory (not shown). Moreover, various applications, components, programs, objects, modules, etc. may also execute on one or more processors in another computer coupled to the computer 810 via the network 840 (e.g., in a distributed or client-server computing environment) where the processing to implement the functions of a computer program may be allocated to multiple computers 820, 830 over the network 840.

In example implementations, circuit macro diagrams have been provided in FIGS. 1-5, whose redundant description has not been duplicated in the related description of analogous circuit macro diagrams. It is expressly incorporated that the same cell layout diagrams with identical symbols and/or reference numerals are included in each of embodiments based on its corresponding figure(s).

Although one or more of FIGS. 1-8 may illustrate systems, apparatuses, or methods according to the teachings of the disclosure, the disclosure is not limited to these illustrated systems, apparatuses, or methods. One or more functions or components of any of FIGS. 1-8 as illustrated or described herein may be combined with one or more other portions of another of FIGS. 1-8. Accordingly, no single implementation described herein should be construed as limiting and implementations of the disclosure may be suitably combined without departing form the teachings of the disclosure.

Aspects of the present disclosure may be incorporated in a system, a method, and/or a computer program product. The computer program product may include a computer-readable storage medium (or media) having computer-readable program instructions thereon for causing a processor to carry out aspects of the present disclosure. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire. For example, the memory 614, the storage device 616, or both, may include tangible, non-transitory computer-readable media or storage devices.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general-purpose computer, a special purpose computer, or other programmable data processing apparatus to produce a machine, such that the instructions, which execute via the processor of the computer or other programmable data processing apparatus. The machine is an example of means for implementing the functions/acts specified in the flowchart and/or block diagrams. The computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the functions/acts specified in the flowchart and/or block diagrams.

The computer-readable program instructions may also be loaded onto a computer, other programmable data processing apparatus, or other device to cause a series of operational steps to be performed on the computer, other programmable apparatus or other device to perform a computer implemented process, such that the instructions which execute on the computer, other programmable apparatus, or other device implement the functions/acts specified in the flowchart and/or block diagrams.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in a block in a diagram may occur out of the order noted in the figures. For example, two blocks shown in succession may be executed substantially concurrently, or the blocks may sometimes be executed in the reverse order, depending upon the functionality involved. It will also be noted that each block of the block diagrams and/or flowcharts, and combinations of blocks in the block diagrams and/or flowcharts, can be implemented by special purpose hardware-based systems that perform the specified functions or acts or carry out combinations of special purpose hardware and computer instructions.

In the following description, numerous specific details are set forth to provide a thorough understanding of the disclosed concepts, which may be practiced without some or all of these particulars. In other instances, details of known devices and/or processes have been omitted to avoid unnecessarily obscuring the disclosure. While some concepts will be described in conjunction with specific examples, it will be understood that these examples are not intended to be limiting.

Unless otherwise indicated, the terms "first", "second", etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

Reference herein to "one example" means that one or more feature, structure, or characteristic described in connection with the example is included in at least one implementation. The phrase "one example" in various places in the specification may or may not be referring to the same example.

Illustrative, non-exhaustive examples, which may or may not be claimed, of the subject matter according to the present disclosure are provided below. Different examples of the device(s) and method(s) disclosed herein include a variety of components, features, and functionalities. It should be understood that the various examples of the device(s) and method(s) disclosed herein may include any of the components, features, and functionalities of any of the other examples of the device(s) and method(s) disclosed herein in any combination, and all of such possibilities are intended to be within the scope of the present disclosure. Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. An integrated circuit comprising:
   a memory macro unit having multiple circuit blocks and at least one break cell that separates the multiple circuit blocks; and
   one or more through silicon vias (TSVs) at least partially coupled through the at least one break cell of the memory macro unit, wherein a keep-out zone surrounds each of the one or more TSVs so as to provide sufficient space between the multiple circuit blocks and each of the one or more TSVs.

2. The integrated circuit of claim 1, wherein the multiple circuit blocks of the memory macro unit comprise:
   one or more word-line decoder blocks;
   one or more memory arrays coupled to the one or more word-line decoder blocks;
   control circuitry coupled to the one or more word-line decoder blocks and the one or more memory arrays;
   respective input/output (I/O) circuitry for each of the one or more memory arrays, wherein each of the I/O circuitry comprises sense amplifier circuitry, a pre-charge circuit, a column multiplexer, and input and output latches.

3. The integrated circuit of claim 2, wherein the one or more TSVs are positioned vertically through perpendicular to the memory macro unit.

4. The integrated circuit of claim 3, wherein the one or more TSVs are configured to transmit power, ground, I/O signals, or address pre-decoding signals.

5. The integrated circuit of claim 1, wherein the integrated circuit comprises two or more memory macro units, and wherein the two or more memory macro units are coupled vertically by the one or more TSVs.

6. The integrated circuit of claim 1, wherein the memory macro unit is folded on two or more tiers.

7. The integrated circuit of claim 1, wherein the integrated circuit is formed through face-to-face wafer stacking, face-to-back wafer stacking, or monolithic 3D integration.

8. An integrated circuit comprising:
   a memory macro unit, and
   one or more through silicon vias (TSVs) at least partially coupled through the memory macro unit, wherein the memory macro unit comprises:
   one or more word-line decoder blocks;
   one or more memory arrays coupled to the one or more word-line decoder blocks;
   control circuitry coupled to the one or more word-line decoder blocks and the one or more memory arrays; and
   respective input/output (I/O) circuitry for each of the one or more memory arrays, wherein each of the I/O circuitry comprises sense amplifier circuitry, a pre-charge circuit, a column multiplexer, and input and output latches, wherein the one or more TSVs are positioned vertically through perpendicular to the memory macro unit, and
   wherein each of the one or more TSVs are respectively positioned adjacent to one or more word-line driver circuitry and a word-line pre-decoding circuitry of the one or more word-line decoder blocks.

9. An integrated circuit comprising:
   a memory macro unit; and
   one or more through silicon vias (TSVs) at least partially coupled through the memory macro unit,
   wherein the memory macro unit comprises:
   one or more word-line decoder blocks;
   one or more memory arrays coupled to the one or more word-line decoder blocks;
   control circuitry coupled to the one or more word-line decoder blocks and the one or more memory arrays; and
   respective input/output (I/O) circuitry for each of the one or more memory arrays, wherein each of the I/O circuitry comprises sense amplifier circuitry, a pre-charge circuit, a column multiplexer, and input and output latches, and
   wherein a first TSV of the one or more TSVs is positioned vertically through a region adjacent to a first I/O circuitry and the control circuitry, wherein a second TSV of the one or more TSVs is positioned vertically through a region adjacent to a second I/O circuitry and the control circuitry.

10. The An integrated circuit comprising:
   a memory macro unit, and
   one or more through silicon vias (TSVs) at least partially coupled through the memory macro unit,
   wherein the memory macro unit comprises:
   one or more word-line decoder blocks;
   one or more memory arrays coupled to the one or more word-line decoder blocks;
   control circuitry coupled to the one or more word-line decoder blocks and the one or more memory arrays; and
   respective input/output (I/O) circuitry for each of the one or more memory arrays, wherein each of the I/O circuitry comprises sense amplifier circuitry, a pre-charge circuit, a column multiplexer, and input and output latches, and wherein a TSV of the one or more TSVs is positioned vertically through a region adjacent to the one or more word-line decoder blocks and the control circuitry.

11. The integrated circuit of claim 10, wherein the one or more TSVs are configured to route global signals comprising: external clock signals, internal memory clock signals, pre-decoded address signals, memory bank read output signals, or memory bank write input signals.

12. The An integrated circuit comprising:
a memory macro unit, and
one or more through silicon vias (TSVs) at least partially coupled through the memory macro unit,
wherein the memory macro unit comprises:
one or more word-line decoder blocks;
one or more memory arrays coupled to the one or more word-line decoder blocks;
control circuitry coupled to the one or more word-line decoder blocks and the one or more memory arrays; and
respective input/output (I/O) circuitry for each of the one or more memory arrays, wherein each of the I/O circuitry comprises sense amplifier circuitry, a pre-charge circuit, a column multiplexer, and input and output latches,
wherein the one or more word-line decoder blocks comprises first and second word-line decoder blocks,
wherein a first TSV of the one or more TSVs is positioned vertically through a region adjacent to a first I/O circuitry and the control circuitry,
wherein a second TSV of the one or more TSVs is positioned vertically through a region adjacent to a second I/O circuitry and the control circuitry,
wherein a third TSV of the one or more TSVs is positioned vertically through a region adjacent to the first word-line decoder block and the control circuit, and
wherein a fourth TSV of the one or more TSVs is positioned vertically through a region adjacent to the second word-line decoder block and the control circuit.

13. An integrated comprising:
a memory macro unit; and
one or more through silicon vias (TSVs) at least partially coupled through the memory macro unit,
wherein the memory macro unit comprises:
one or more word-line decoder blocks;
one or more memory arrays coupled to the one or more word-line decoder blocks;
control circuitry coupled to the one or more word-line decoder blocks and the one or more memory arrays; and
respective input/output (I/O) circuitry for each of the one or more memory arrays, wherein each of the I/O circuitry comprises sense amplifier circuitry, a pre-charge circuit, a column multiplexer, and input and output latches, and
wherein each of the one or more memory arrays comprise first and second break cells, and wherein each of the first and second break cells are configured to divide each of the two or more memory arrays into first and second portions.

14. The integrated circuit of claim 13, wherein one TSV of the one or more TSVs is positioned vertically through the memory arrays vertically and adjacent to the first and second break cells.

* * * * *